US007507916B2

(12) United States Patent
Kessler

(10) Patent No.: US 7,507,916 B2

(45) Date of Patent: Mar. 24, 2009

(54) SPHERIC ALIGNMENT MECHANISM

(76) Inventor: Stephen Burns Kessler, 639 W. Rose Hill, Kirkwood, MO (US) 63122

(*) Notice: Subject to any disclaimer, the term of this patent is extended or adjusted under 35 U.S.C. 154(b) by 361 days.

(21) Appl. No.: 11/108,424

(22) Filed: Apr. 18, 2005

(65) Prior Publication Data

US 2005/0265508 A1 Dec. 1, 2005

Related U.S. Application Data

(60) Provisional application No. 60/570,514, filed on May 12, 2004, provisional application No. 60/564,013, filed on Apr. 21, 2004, provisional application No. 60/563,427, filed on Apr. 19, 2004.

(51) Int. Cl.
*H05K 9/00* (2006.01)

(52) U.S. Cl. .................... 174/377; 174/125.1; 505/236

(58) Field of Classification Search ................ 335/216; 174/377, 125.1; 361/816, 818, 800; 505/236
See application file for complete search history.

(56) References Cited

U.S. PATENT DOCUMENTS

| | | | | |
|---|---|---|---|---|
| 4,874,346 | A | 10/1989 | Wachspress | |
| 5,267,091 | A | 11/1993 | Chen | |
| 5,430,009 | A | 7/1995 | Wang | |
| 5,590,031 | A | 12/1996 | Mead, Jr. et al. | |
| 5,831,362 | A | 11/1998 | Chu et al. | |
| 5,841,211 | A | 11/1998 | Boyes | |
| 6,024,935 | A | 2/2000 | Mills et al. | |
| 6,193,194 | B1 | 2/2001 | Minovitch | |
| 6,318,666 | B1 | 11/2001 | Brotz | |
| 6,960,975 | B1 * | 11/2005 | Volfson | 335/216 |
| 7,150,089 | B2 * | 12/2006 | Scafidi | 29/463 |
| 2005/0107681 | A1 * | 5/2005 | Griffiths | 600/410 |
| 2005/0272996 | A1 * | 12/2005 | Matsui et al. | 600/409 |

OTHER PUBLICATIONS

Y. Xiao et al., "Magnetic Flux Distribution on a Spherical Super Conducting Shell", Physica B, 194, pp. 65-66, 1994.

Mauro M. Doria and Antonia R. de C. Romaguera, "Transition to a Superconductor with Insulating Cavities", arXiv:condu-mal/0407599 v1 Jul. 22, 2004, pp. 1-7.

Qiang Du and Lili Ju, "Approximations of a Ginzburg-Landau Model for Superconducting Hollow Spheres Based on Sperical Controidal Voronoi Tessellations", pp. 1-23, no date.

Presentation of "Waste Disposal Assessment for the Final Focusing Magnets in the RPD-2002" at ARIES Project Meeting, May 5-6, 2003; by Jeff Latkowski and Wayne Meler; pp.

Non-Integer Flux Quanta for a Spherical Superconductor, Joonhyun Yeo; Department of Physics, Kon-Kuk University, Seoul, Korea, M.A. Moore; Jul. 8, 2004; pp. 1-15.

(Continued)

*Primary Examiner*—Hung V Ngo
(74) *Attorney, Agent, or Firm*—Dennis J. M. Donahue, III; Husch Blackwell Sanders, LLP

(57) ABSTRACT

A chamber for manipulating a work product is formed in layers as a series of nested shells. The shells have an outer structural casing and an electromagnetic shield that surrounds a superconducting shell. The superconducting shell is immersed in a cryogenic coolant contained in a reservoir. The work product is further manipulated using kinetic energy and electromagnetic energy.

32 Claims, 7 Drawing Sheets

OTHER PUBLICATIONS

Numerical Simulations of the Quantized Vortices on a Thin Superconducting Hollow Sphere; Journal of Computational Physics 201 (2004); Qiang Du and Lili Ju; pp. 511-530.

B. Baelus, F. Peeters, V. Schweigert, “Saddle-point states and energy barriers for vortex entrance and exit in superconducting disks and rings,” Phys. Rev. B 63 (2001) 144517.

B. Ianotta, Music of the spheres, New Scientist 31 (1996) 28-31.

Daul, Jean-Marc, Grangler, Philippe, “Vacuum-field atom trapping in a wide aperture spherical resonator”, http://arxiv.org/abs/quant-ph/0311048, no date.

D.Y. Vodolazov, F.M. Peeters, Dynamic transitions between metastable states in a superconducting ring, Phys. Rev. B 66 (2002) 054537.

M. Dodgson, M.A. Moore, “Vortices in a thin-film superconductor with a spherical geometry,” Phys. Rev. B 55 (1997) 3816-3831.

Robertson, Stanley L, “Newtonian Gravity Predictions For Gravity Probe B” http://arxiv.org/abs/gr-qc/0502088, no date.

V. Fomin, V. Misko, J. Devreese, V. Moshchalkov, Superconducting mesoscopic square loop, Phys. Rev. B 58 (1998) 11703-11715.

V. Schweigert, F. Peeters, P. Deo, “Vortex phase diagram for mesoscopic superconducitng disks,” Phys. Rev. Lett. 81 (1998) 2783-2786.

Science, Oct. 3, 2003, vol. 302, www.sciencemag.org,; The Anomalous Hall Effect and Magnetic Monopoles in Momentum Space; by Zhong Fang, et al.

http://background.uchicago.edu/~whi/intermediate/intermedicate.html with Prologue pages.

Dec. 10, 2007 Notification of Transmittal of The International Search Report and The Written Opinion of the Internaitonal Searching Authority, or the Declaration.

U.S. Appl. No. 10/998,401, pending, Volfson.

* cited by examiner

10
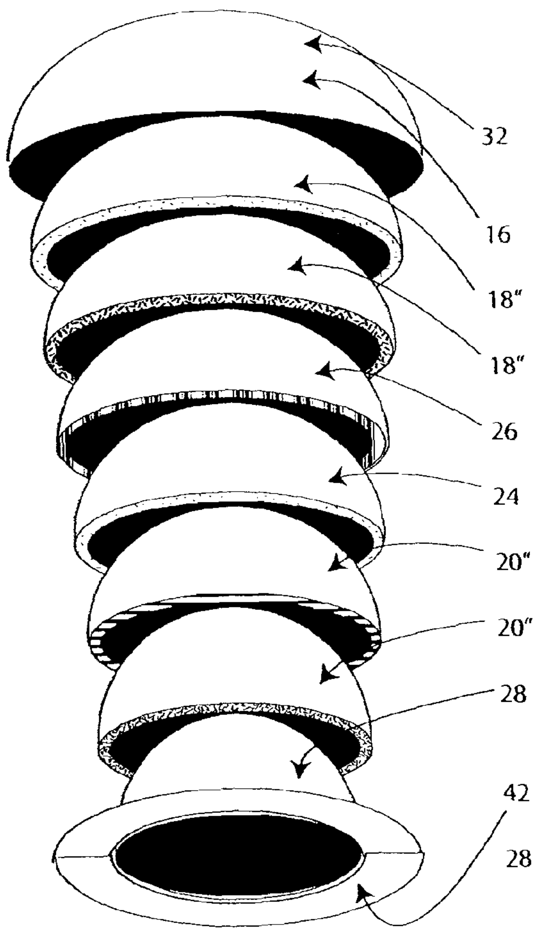
FIG. 3A
FIG. 3B
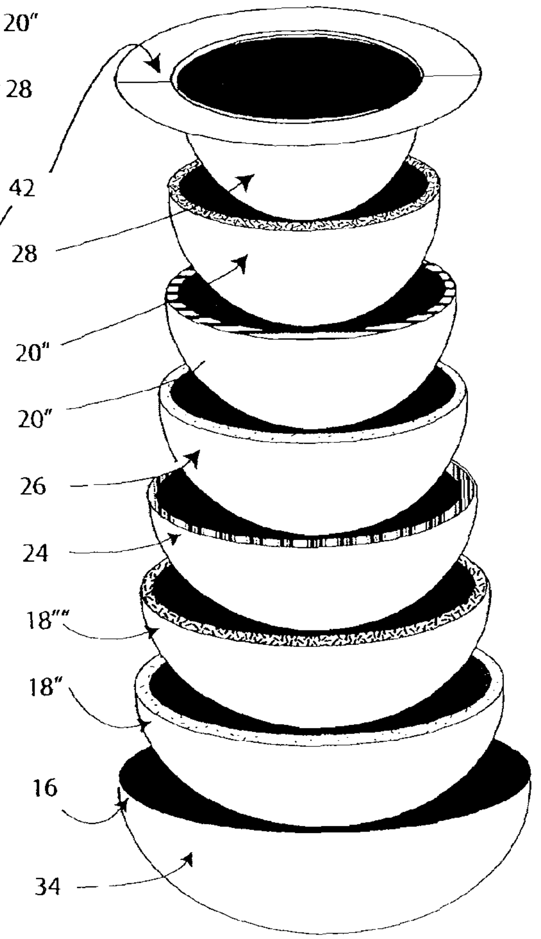

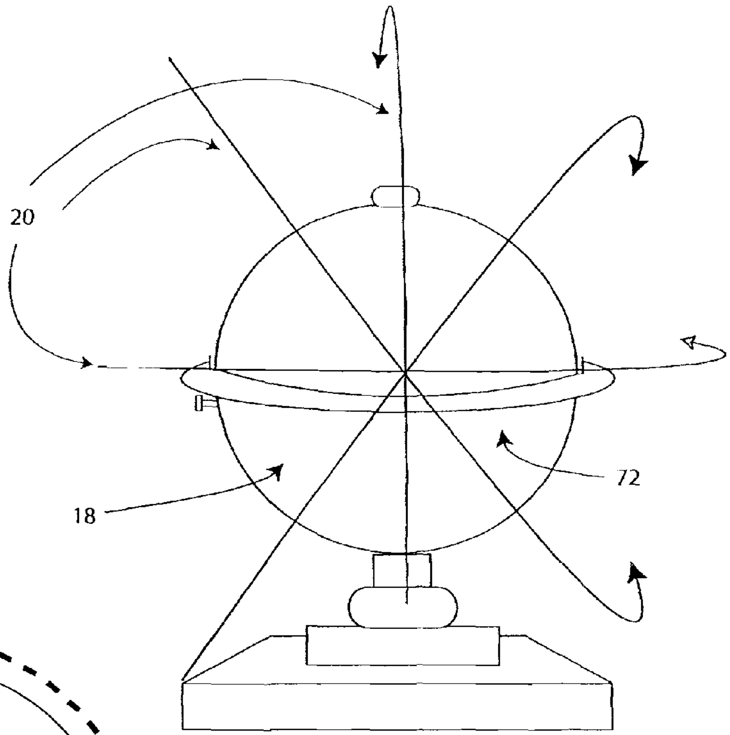
FIG. 09
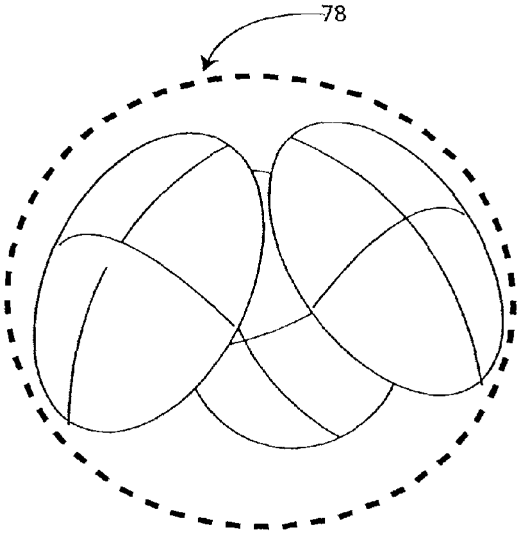
FIG. 11
FIG. 10
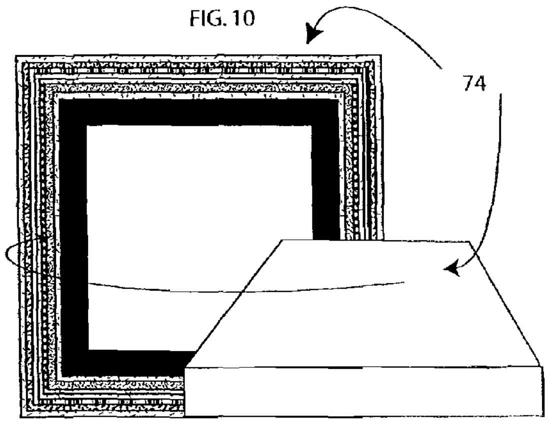

SPHERIC ALIGNMENT MECHANISM

CROSS-REFERENCE TO RELATED APPLICATIONS

This application claims the benefit of U.S. Provisional Application Nos. 60/563,427, 60/564,013 and 60/570,514, respectively filed on Apr. 19, 2004, Apr. 21, 2004 and May 12, 2004, and the disclosures of these provisional applications are incorporated herein by reference.

BACKGROUND OF THE INVENTION

1. Field of the Invention

The present invention relates to superconductive materials, and more particularly, to a superconducting shell with electromagnetic shielding surrounding a work product in an entropically isolated environment.

2. Related Art

Generally, quantum physics predicts that all of space is filled with zero-point fluctuations, also called the zero-point field, creating a universal sea of zero-point energy. The density of this energy depends critically on where in frequency the zero-point fluctuations cease. Since space itself is thought to break up into a kind of quantum foam at a tiny distance scale called the Planck scale ($10^{-33}$ cm), it is argued that the zero point fluctuations must cease at a corresponding Planck frequency ($10^{43}$ Hz). According to this theory, the zero-point energy density would be 110 orders of magnitude greater than the radiant energy at the center of the sun.

There are numerous patents whose claims use electromagnetic radiation to facilitate conversion of zero point energy into usable electrical energy, such as U.S. Pat. No. 5,590,031. It has also been suggested that a superconducting sphere could be used to interact with an external geomagnetic field to propel a vehicle within the field, such as in U.S. Pat. No. 6,318,666. However, these prior devices fail to disclose or suggest a superconducting shell according to the present invention, which does not interact with an external geomagnetic field, or any other ambient magnetic or electrical field, but instead shields the interior of the shell from such fields. Therefore, these prior devices cannot provide an entropically isolated environment for a work product within such devices.

SUMMARY OF THE INVENTION

Generally, the present invention provides an entropically isolated environment for a work product within a chamber. In particular, the present invention is a chamber formed by a series of nested shells that shield a work product within the chamber from electromagnetic fields from the ambient environment around the chamber, and with at least one shell being superconductive. The superconducting shell can be made of either overlapping individual superconductors or made of a solid superconductor wall. The work product can be manipulated using kinetic energy and electromagnetic energy.

The present invention effects zero point energy on atomic strong/weak force and molecular structures by creating an entropically isolated environment in which ambient electromagnetic fields are minimized during the critical initiating phase of energetic conversion of zero point energy. More particularly, the chamber of the present invention maintains a mixed state of low entropy followed by high entropy and effects atomic and molecular structures of the work product placed within the chamber. Accordingly, the chamber can be used in biophysics/life sciences, electronics, computer science, energy production, particle physics, electromagnetism, chemistry, pharmaceuticals and materials production.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 3A and 3B illustrate an exploded view of the chamber of FIG. 1;

FIG. 9 illustrates a schematic representation of a gyroscopic embodiment; and FIGS. 10 and 11 illustrate alternative embodiments of the present invention.

DETAILED DESCRIPTION OF THE PREFEREED EMBODIMENTS

Figure 1:
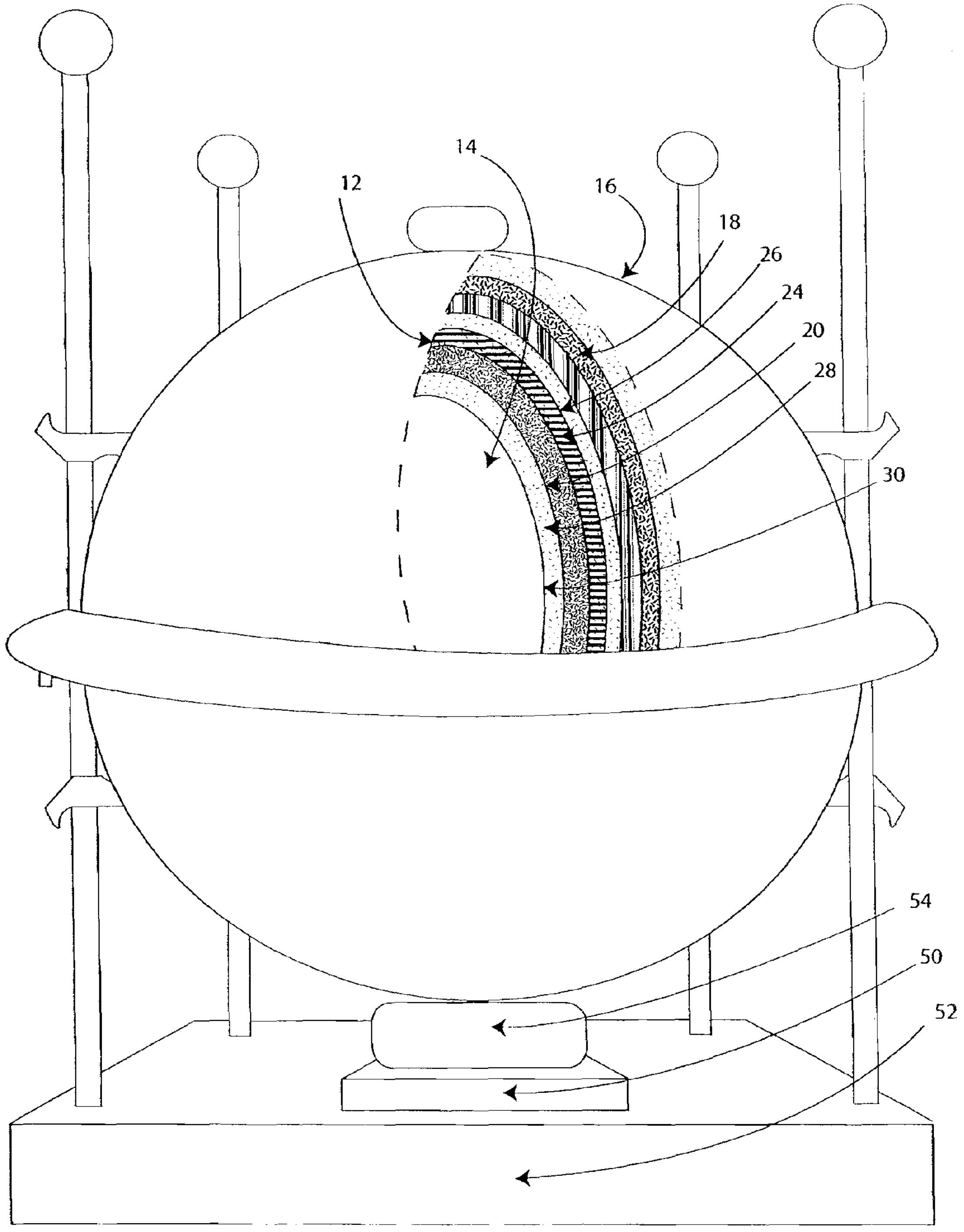
FIG. 1 illustrates an isometric, cutaway view of the present invention.

Referring to the accompanying drawings in which like reference numbers indicate like elements, FIG. 1 illustrates a cutaway view of the spheric alignment mechanism chamber 10 in an exemplary embodiment. The chamber 10 is formed in layers as a series of nested shells 12 which surround the work product 14 at the interior portion of the chamber 10. An outer structural casing 16 forms the exterior surface of the chamber 10. Within the structural casing 16, an electromagnetic shield 18 which surrounds a superconducting shell 20. The superconducting shell 20 is preferably immersed in a cryogenic coolant 22 contained in a reservoir 24. The reservoir 24 is preferably formed by a pair of Dewar flasks 26, 28 on opposite sides of the superconducting shell 20, i.e. the superconducting shell is sealed between the outer Dewar flask 26 and inner Dewar flask 28. The inner Dewar flask 28 is preferably protected by an inner casing 30 around the interior portion of the chamber 10.

Figure 2B:
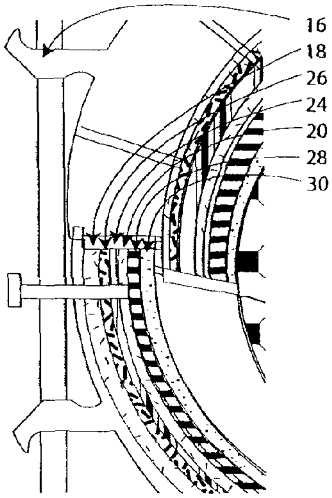
FIGS. 2A, 2B and 2C illustrate cross-sectional views of the chamber of FIG. 1.
Figure 2A:
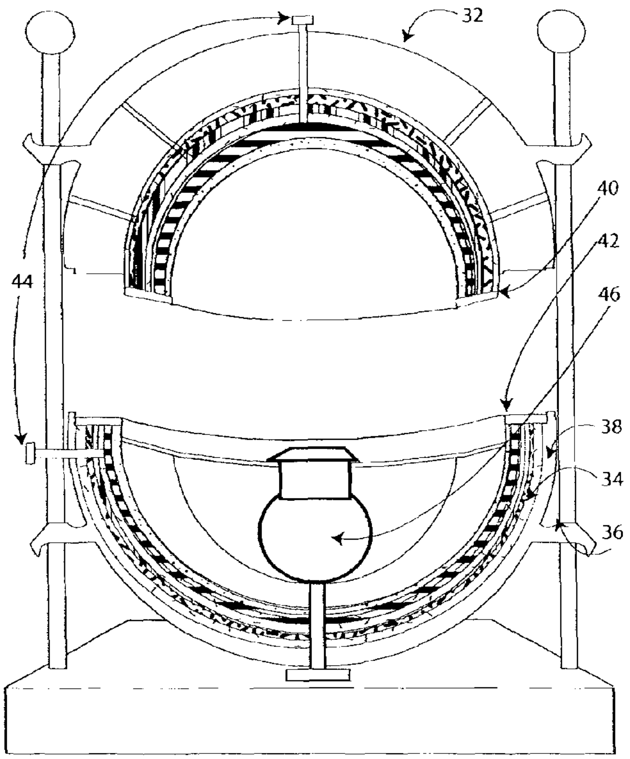

As illustrated in FIG. 2A, the chamber 10 can be formed from two interconnected hemispheres 32, 34 within a support structure 36. In particular, poles 38 can align the hemispheres 32, 34 while permitting the upper hemisphere 32 to slide relative to the lower hemisphere 34 and holding the lower hemisphere 34 in place. The hemispheres 32, 34 preferably include overlapping sections 40 that are sealed together with a flange 42 that may provide a pressure-seal 42'. A detail view of the chamber's layers 12 in the overlapping section 40 is illustrated in FIG. 2B. Each of the hemispheres 32, 34 preferably has an intake valve 44 through which the cryogenic coolant can be circulated. While the chamber 10 is open, the work product 14 can be set onto a platform 46 or placed directly onto the interior surface.

Figure 2C:
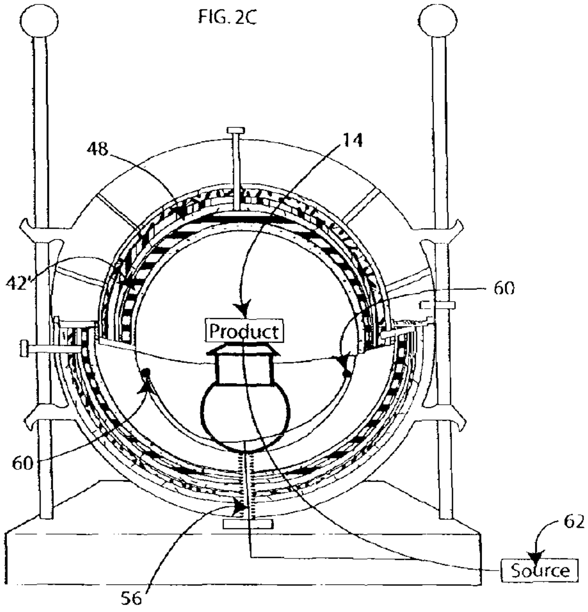
Figure 2C:
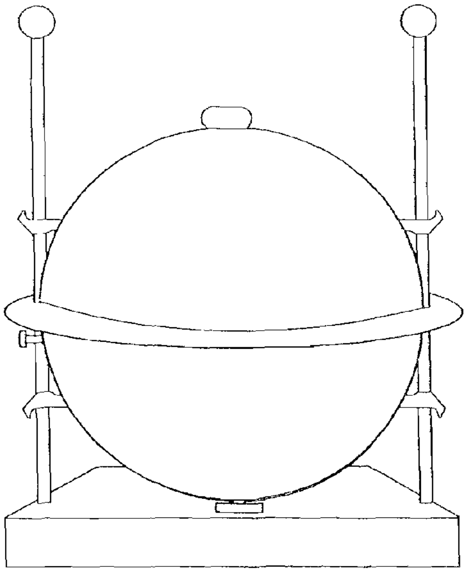

As illustrated in FIG. 2C, once the chamber 10 is closed, the work product 14 and the interior of the chamber 10 is shielded from outside electromagnetic radiation 48, including electric and magnetic fields and noise. Inside the closed chamber 10, the work product 14 is situated in an entropically isolated environment. In particular, when the chamber 10 is open, the work product 14 within the chamber is at an entropic level approximately equivalent to the ambient environment around the exterior of the chamber 10. However, once the chamber 10 is closed, the interior of the chamber 10, including the work product 14, has a higher entropic stasis level. The electromagnetic shield 18 can be made from any number of materials, including lead, niobium, and metal alloys such as alloys known as MUMETAL and/or METGLAS, as well as combinations of such shielding materials. For example, lead foil and/or niobium backing can be manufactured with or added to the Dewar flasks 26, 28. An interior vacuum or pressurization can be created within the chamber 10 relative to standard atmospheric conditions through a vacuum or pressurization system and sealed by the pressurized flange 42, respectively. The work product table 46 can contain the mechanisms for these systems 46', 46".

An exploded view of the chamber's layers 12 are illustrated in FIGS. 3A and 3B. The superconducting shell may be formed as a solid, continuous shell 20', as overlapping shell sections 20" or any equivalent thereof. It will be appreciated that nested superconducting shells can also be used in the other embodiments of the present invention. As discussed above, it is preferable to completely surround the interior region of the chamber 10 by the superconducting shell 20. The shielding 18 can be made from multiple layers, such as one layer of MUMETAL and/or METGLAS 18' that can be combined with lead foil and/or niobium backing 18".

It will be appreciated that the chamber's interior 10 can be maintained at a pressure and temperature equivalent to the surrounding ambient conditions, and does not need to be cryogenically cooled or evacuated to increase the entropic stasis level within the chamber 10 over that of the ambient environment outside the chamber 10. When a cryogenic coolant is used, the double-Dewar flasks minimize the heat-transfer between the coolant and the interior and exterior of the chamber 10. Examples of cryogenic coolants include liquid nitrogen, liquid hydrogen, liquid helium and solid nitrogen in aluminum foam. It will also be appreciated that any superconductive element can be used in the present invention, including superconductors now known as type-1 and type-2, and their equivalents, including any superconductor that may be made from materials that are superconductive at sea-level standard conditions, i.e., room temperature. For some applications, a single Dewar flask may be used.

Figure 4:
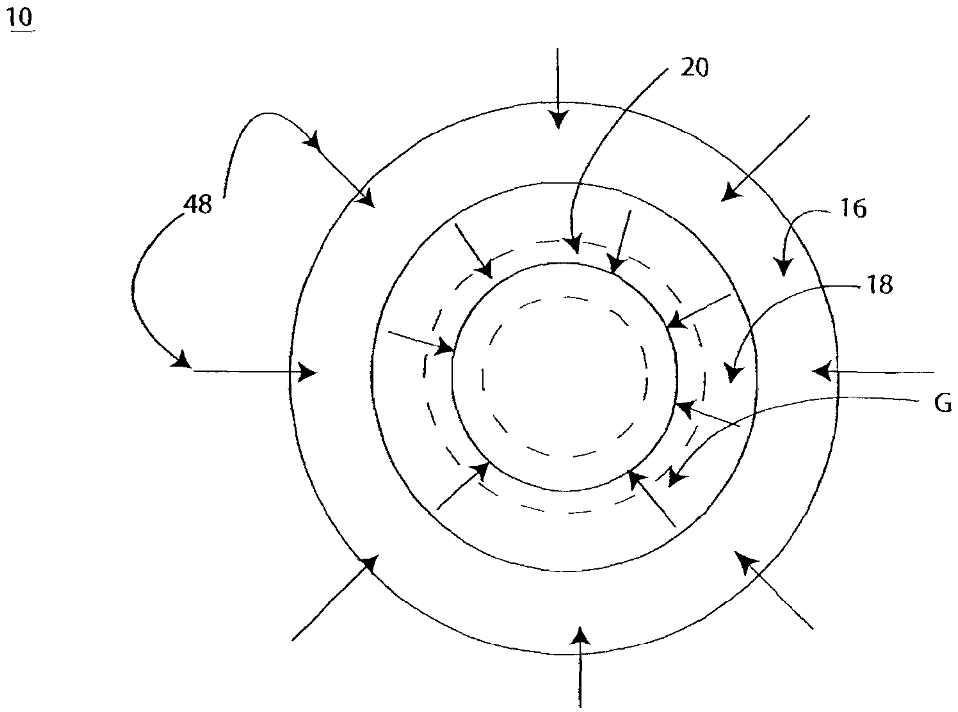
FIG. 4 illustrates a schematic representation of the present invention.

The general schematic arrangement of the chamber is illustrated in FIG. 4, coulombically represented as a Gaussian surface (G) with a sphere of radius R lying just above the surface of the superconductive shell. The design of the chamber 10 enables electromagnetic field decay in the interior chamber by creating the entropically isolated environment. The equation for electric flux, according Gauss' law, is provided in equation 1 below, where A is the area of the surface and e is the electric field strength just above the surface of the conductor:

$$\Phi_B = eA = \frac{-Q}{\varepsilon_0}, \quad [1]$$

As discussed above and illustrated in FIG. 4, the interior of the chamber 10 is shielded from the electromagnetic fields 48, and as discussed in more detail below with reference to FIG. 3B, the chamber can include an electromagnetic pulse generator to alter the chamber's internal entropic state.

Figure 5:
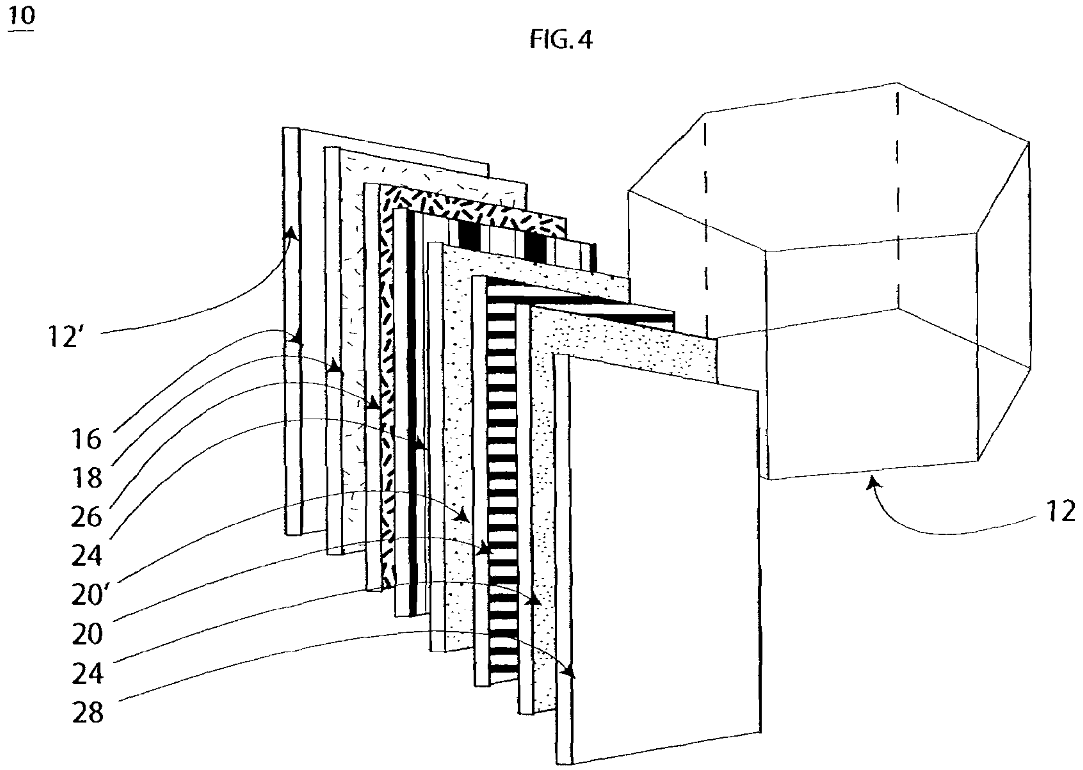
FIG. 5 illustrates an alternative embodiment of the present invention.

It will also be appreciated that the chamber 10 is not limited to being formed in the shape of a sphere and does not necessarily need to be made from a pair of hemispheres 32, 34. The chamber 10 can be formed in any geometric shape and from any number of sections that enclose the work product 14, such as illustrated in FIGS. 5, 6 and 7. As illustrated in FIG. 5, the chamber 10 can be formed by wall sections 12'. Each wall section 12' is formed from a set of nested shells 12 similar to those discussed above with respect to FIGS. 1, 2 and 3. As with the hemisphere shells 12, the wall sections 12' may overlap each other. Generally, the shells 12, 12' surround the work product 14 and permit the entry of the work product 14 into the interior portion of the chamber 10.

As particularly illustrated in FIG. 5, the wall sections 12' can be flat panels with the outer structural casing 16 and electromagnetic shield 18 surrounding the superconducting shell 20. These walls can enclose an operating area, reducing cellular necrosis for a patient with biophysical trauma. In one operating environment, exotic materials such as solid nitrogen and aluminum foam could be used, along with a niobium with METGLAS faced superconducting wall encased within a Dewar that is sealed in insulation and a metal casing.

Figure 6A:
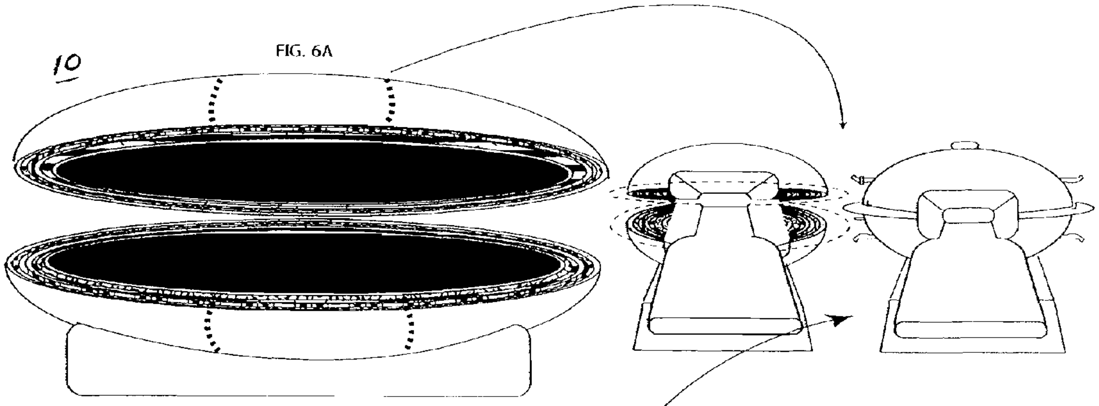
FIGS. 6A and 6B illustrate an alternative embodiment of the present invention.
Figure 7:
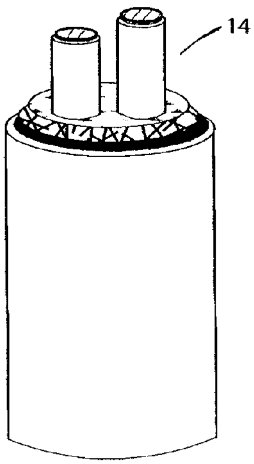
FIG. 7 illustrates an alternative embodiment of the present invention.
Figure 6B:
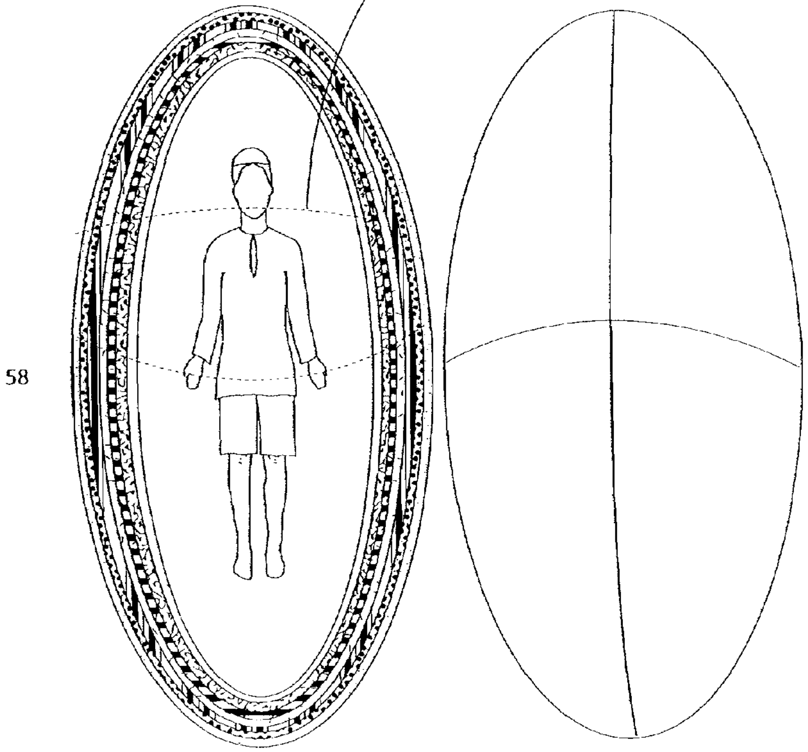

FIG. 6A illustrates an embodiment in which the chamber 10 is a version of FIG. 1 elongated in the x-axis with shells 12 formed in an ellipsoid shape, and FIG. 7 particularly illustrates an embodiment of the chamber 10 in which the shells 12 are cylindrical and form a sheath 12" around the wire as the work product 14. The ellipsoid device can be used to reduce cellular necrosis resulting from a blunt trauma by placing a person within the chamber, illustrated in FIG. 6B. The chamber can be sized for portability, such as by removing the ends of the chamber, i.e., the ends identified by the dashed lines in FIGS. 6A and 6B. This portable embodiment can be sized as a spheric suspension jacket is an example of a partially enclosed chamber 10 that surrounds the work product, or person, by completely enclosing the patient from the neck to the thighs. The spheric suspension jacket can be used to reduce cellular necrosis for a patient with biophysical trauma in an ambulatory environment. This is accomplished by suspending environmental ambient electromagnetic field interaction on cells in the patient's spinal cord, minimizing celluar necrosis and temporarily stabilizing injury pending transfer into a full pod or suspension surgical theater for advanced trauma care. The sheathed wire device of FIG. 7 can be used to power electronic equipment within any one of the chambers 10.

Within the closed interior chamber 10, the work product 14 can be manipulated between its high entropy stasis and a lower entropy excitation mode. Excitation of the work product 14 and the interior chamber 10 can be performed by introducing electromagnetic and/or kinetic energy into the chamber 10. One example of transmitting kinetic energy into the chamber is a drive 50 that may be housed in the base 52 and which rotates the chamber 10. Another example would be a sound perturbation system 54, which may also be housed at the base 52 or elsewhere around the chamber 10. The sound perturbation system 54 can be tuned to the material frequencies of the work product 14. The amplifier and speaker can be outside the chamber 10, and the sound can be projected into the chamber 10 through a tuned resonant tube 56 and can be directed or otherwise focused to perturb the work product. Preferably, the tuned resonant tube is constructed using materials that enhance resonance and also provide shielding properties, such as METGLAS. Accordingly, the chamber 10 of the present invention eliminates, avoids and/or minimizes electromagnetic radiation during the critical initiating phase of energetic conversion of zero point energy by maintaining a mixed state of low entropy on one and followed immediately by high entropy in the other.

As an example of such kinetic energy manipulation, a yttrium work product 14 can be placed within the open chamber 10. The chamber 10 is closed and sealed, and sound waves of yttrium quantum vibration or associated frequency played from a storage medium are created by the sound perturbation system 54, projected into the chamber 10. For composite materials, the quantum vibrations will be a spectrum based on the composite's component materials, creating and blended to enable harmonic oscillations.

Electromagnetic energy can also be transmitted into the chamber 10 by a number of methods. A wire 58 can connect electromagnetic circuits 60 within the chamber 10 to an energy source 62 outside the chamber 10. Well-known electromagnetic circuits 60 can be used to excite the work product 14, such as a magnetic field generator, an electromagnetic field pulse initiator, a laser, and a light. The wire 58 preferably conducts electricity to the circuits 60 through the base 52. The wire 58 is preferably electromagnetically shielded and enclosed within a superconductive sheath 12" as illustrated in FIG. 7 and the electrodes may be similarly formed. Multiple wires 58 can connect to multiple electrodes and other electromagnetic circuits 60 within the chamber 10. The electromagnetic devices can be situated on the platform 46 or spaced around the interior side of the shells 12. For example, the electromagnetic devices can be spaced at four equidistant points around the hemispheres 32, 34. As yet another example illustrated in FIGS. 8A and 8B, the electromagnetic devices can be spaced at six points.

Figure 8A:
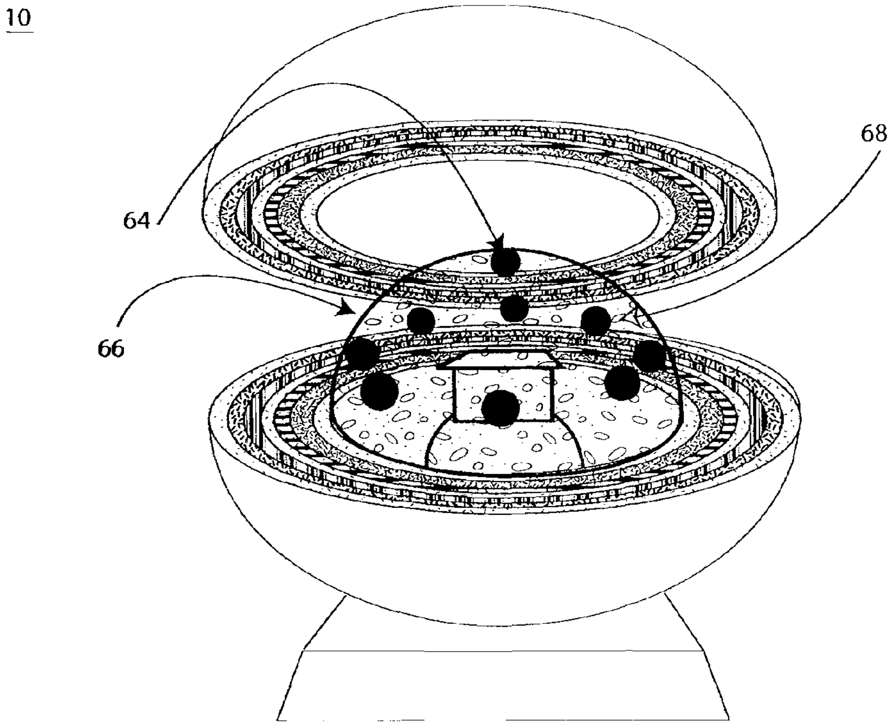
FIGS. 8A and 8B illustrate interior sectional views of the chamber.
Figure 8B:
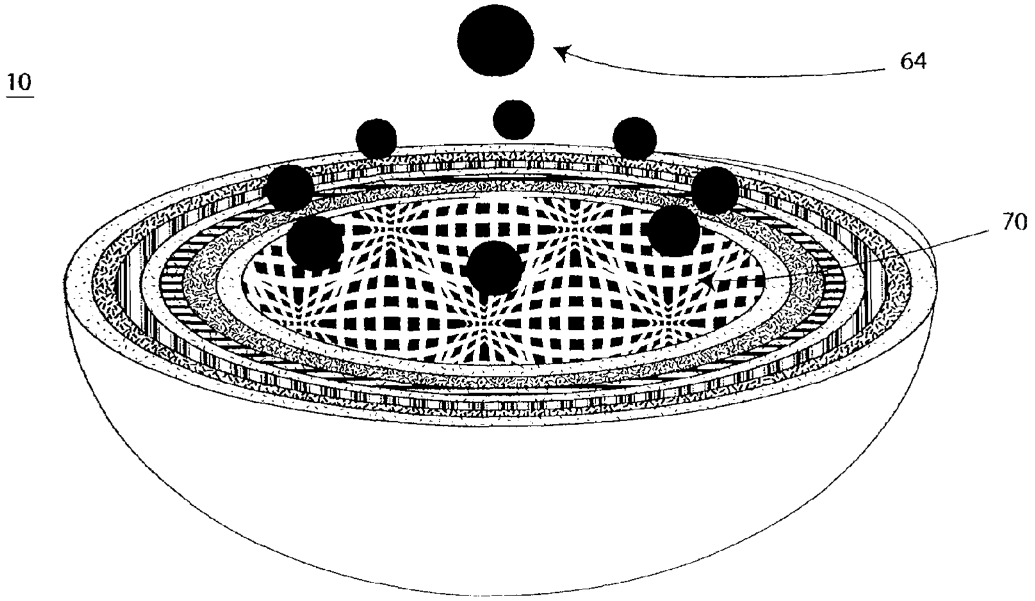

As particularly illustrated in FIGS. 8A and 8B, six point field initiators 64 can be situated in a niobium lattice 66 within the chamber 10, and can be powered by wires 58 entering through the base 52. Without listing all types field initiators, the function of the initiators is to create electromagnetic fields 68 within the chamber such as light, including the visible spectrum and coherent laser light, spark gap, as well as radio through gamma waves. The field pulse is variable, and the electromagnetic fields are used to initiate a low entropy pulse. As discussed in relation to the sound perturbation system 54 above, sound can also be used for high entropy interaction in the atomic and molecular structure of the work product. Additionally, the interior portion of the chamber can be fitted with an anechoic insert 70. A large chamber can use a superconducting quantum interference device (SQuID) to measure the resonant potential of varying molecules in the high entropy chamber and then initiate a harmonic frequency using the pulse driver to realign the molecular structures. The anechoic insert 70, and other similar inserts, can be used to limit external sounds and vibrations from entering the chamber and to facilitate directing sound within the chamber.

A miniaturized, electromagnetically-isolated Bose Einstein optical table can used create new phase forms of matter from condensed states. In this phase form, matter can be additionally perturbed by a mechanical device similar to a diamond anvil pressure type cell, creating the potential for effectively forcing two varying forms of matter together. According to the present invention, it would take significantly less pressure and energy than presently known systems that do not apply pressure and energy in a high entropy environment, such as found inside the chamber 10. For example, according to the Osaka University experiments on superconducting magnetic metals, such as reported in the Journal of Physics: Condensed Matter, Vol. 14, p. 10467-10470 (published Nov. 11, 2002), researchers discovered the onset of superconductivity in the case of iron under pressure. In particular, using electrical resistance measurements, a maximum value of the superconducting transition temperature of 2 K is observed under pressure of 20 GPa. The researchers also reported the phenomenon as it relates to the Meissner effect based on the detection of the diamagnetic signal. According to the present invention, the Osaka University experiments will require significantly less energy and pressure within the high entropy chamber that is created by the electromagnetic shield 18 and the superconducting shell 20 according to the present invention. Therefore, the chamber 10 will also be able to more efficiently create Bose-Einstein condensates and conditional artificial gravity-like fields that are proportional to the force exerted.

Multiple superconducting shells 20 can also be nested together in the present invention. For example, the gyroscopic embodiment schematically illustrated in FIG. 9 has four nested superconducting shells 20. As with all of the embodiments, external electromagnetic fields are shielded from the interior of the chamber 10, such as discussed above with regard to the shielding of electromagnetic radiation, electrical fields and magnetic fields by the electromagnetic shield 18. To create the gyroscopic effect, each of the nested shells can have a banded power strip 72 directing electric current in different directions (x+, x−, y+45°, z−45°) emulating the motion of a moving gyroscope. The electrical signals can be established in each of the spheres through individual initiating switches or by computer program that controls the flow of electricity through each sphere.

A given gyroscope moment G will always result in the same ratio of energy to frequency. Another example is an electron in an external magnetic field. The electron has a gyroscopic moment and a magnetic field. An electron has electromagnetic radiative losses and operates in a linear external magnetic field that serves to invert it. However, gyroscopic math is identical with the electron's gyroscopic moment being h/2, as set forth in equation 2 below where E is energy v is precession of the primary axis, G is the gyroscopic moment and h being Plank's constant.

$$
\begin{aligned}
E/v &= 2\cdot G \\
&= 2\cdot(h/2) \\
&= h,
\end{aligned}
\qquad [2]
$$

Plank's constant h, owing nothing to the electromagnetic world, is a purely gyroscopic property. The concept that the electron spin is ½ is related to its gyroscopic moment being h/2. In an additional embodiment with room-temperature superconductors, it could also be possible to physically rotated each of the spheres. With room-temperature superconductors, it could also be possible to physically rotate each of the spheres.

Four different superconducting walls can be used with the present invention. The four superconducting walls have independent rotation each be manipulated through a spinning mass, such as a disk/wheel, mounted on the base so that its axis can turn freely in one or more directions and thereby maintain its orientation regardless of any movement of the base motor and shaft. Electromagnetic energy can also be directed across the surface of the four different, spatially-separated spheres in different directions enabling a stationary electromagnetic gyroscope. For embodiments in which the nested shells 12 includes the coolant reservoir 24, electromagnetic fields, lasers or visible light, invisible light including all waveforms from radio to gamma, magnetic fields or a combination thereof may also be used.

From the above description and the corresponding illustrations, it will be appreciated that the present invention uses the superconducting fields to alter the zero point energy system within the chamber 10. As such, the chamber 10 serves as a catalyst for increasing the efficiency in manipulating materials through the transfer of energy. In particular, within the closed chamber, the strong and weak force on atomic volume of the work product 14 are at a lower order configuration and confirmation, and the work product can then be perturbed/excited by the electromagnetic and/or kinetic energy fields to enable higher order manipulation of the work product's atomic and molecular structures. Additionally, the chamber 10 can be formed in different shapes and sizes. For example, the chamber illustrated in FIG. 5 can be large enough to enclose people, equipment and other structures and the chamber illustrated in FIG. 6 can be small enough to be portable. The chamber 10 can be used for altering atoms a work product 14, which can range from inanimate materials and objects to biophysical organisms and even human patients. Accordingly, the chamber can be used in life sciences to minimize cellular necrosis caused by blunt force trauma. The chamber raises overall entropy of the patient's atomic and molecular structures, allowing for localized medical intervention with minimal damage to systemic tissues. Therefore, the chamber could also be used as an operating room for surgical intervention to minimize damage to systemic tissues. The chamber can be used in manufacturing to alter material properties of chemicals, pharmaceuticals, superconductors, computer components, communication devices by effecting molecular configuration and confirmation. According to these embodiments, it will be appreciated that various geometric shapes can be used to accomplish the same electromagnetic isolated environment. For example, FIG. 10 illustrates electronic equipment 74 that can have a casing 10 made according to the present invention.

There is electromagnetic shielding uniformly around the device regardless of its geometry; be it a parabola, triangle, cube, tube or other geometric shape. As evident from the various embodiments illustrated, different geometric shapes can be utilized to accomplish the same electromagnetic isolated environment. For example, as particularly illustrated in FIG. 11, a chamber 10 is created by parabolic-focused sections 76 within an electromagnetically isolated environment 78. One example of such an electromagnetically isolated environment 78 would be a room designed to completely shield outside electromagnetic fields from entering the interior chamber. Each of the six concave superconducting surfaces 76 focus on a center point area that contains the work product. From this embodiment of the present invention, it will be appreciated that within the electromagnetically isolated environment 78, the chamber 10 can surround the work product with a partial enclosure.

Generally, within the closed chamber, a low ordered high entropy stasis field is maintained, and the amount of internal energy to perturb atomic spherics strong and or weak force is minimal. Accordingly, the forces necessary to perturb atoms or molecules of the work product 14 within stasis fields of the closed chamber 10 are proportionately low compared to the forces necessary outside of the chamber. The present invention permits the formation of new molecular structures, stronger molecular bonds on existing elements, alterations in stable atomic structures and neutralization of radiation, and even the creation of new forms of matter and gravitational probability waves from existing Bose Einstein Condensates.

The description of the invention is merely exemplary in nature and, thus, variations that do not depart from the gist of the invention are intended to be within the scope of the invention. From the description of the embodiments above, it will be appreciated that sound is the preferred perturbator of the work product, but other types of kinetic energy and even energy can be used to manipulate the work product. As examples of these alternative manipulators, pressure, light and electromagnetic energy are particularly discussed. Regardless of the type of energy that is used within the chamber 10 on the work product, the interior of the chamber 10 is electromagetically shielded from its ambient environment. Therefore, all electrical input into the chamber 10 enters through a electromagnetically shielded superconducting wire and does not introduce any electromagnetic fields into the ambient state absent the controlled perturbation of the work product within the chamber. Accordingly, such variations are not to be regarded as a departure from the spirit and scope of the invention.

What is claimed is:

1. A chamber for reducing strong force bonds in a work product, comprising:

an electromagnetic shield positioned around the work product, wherein said electromagnetic shield is substantially impervious to electromagnetic radiation, electrical fields and magnetic fields; and a superconducting shell situated within said electromagnetic shield and surrounding the work product; and a sound perturbation system in operative communication with the work product in said superconducting shell.

2. The chamber set forth in claim 1, wherein said electromagnetic shield is selected from the group of materials consisting of lead, niobium, a metal alloy, and any combination thereof, and wherein said superconducting shell comprises a plurality of overlapping sections having at least one interconnection therebetween, wherein at least one of said overlapping sections moves relative to said other of said overlapping sections at said interconnection to provide an open position for said superconducting shell and a closed position for said superconducting shell.

3. The chamber set forth in claim 2, wherein said overlapping sections are further comprised of a pair of interconnected hemispheres having said open position and said closed position and a flange between said pair of interconnected hemispheres, wherein at least one of said pair of interconnected hemispheres overlaps the other of said pair of interconnected hemispheres and wherein said flange provides a pressure seal.

4. The chamber set forth in claim 1, wherein said superconducting shell is selected from the group of superconducting walls consisting of a plurality of overlapping superconductive elements, a continuous superconductive element, and a pair of opposing, interconnected superconductive halves.

5. The chamber set forth in claim 1, further comprising a base to which said electromagnetic shield is mounted, said base being situated outside an exterior of said electromagnetic shield and said superconducting shell.

6. The chamber set forth in claim 1, wherein said superconducting shell further comprises a plurality of parabolic sections, said electromagnetic shield isolating the work product from electromagnetic fields external to said electromagnetic shield and said parabolic sections partially enclosing and focused on the work product.

7. The chamber set forth in claim 1, further comprising a reservoir containing a coolant in which at least one side of said superconducting shell is at least partially immersed.

8. The chamber set forth in claim 1, further comprising a pair of Dewar flasks on opposite sides of said superconducting shell, at least one coolant within said pair of Dewar flasks and a coolant intake valve, wherein said pair of Dewar flasks form a reservoir containing said coolant and said superconducting shell, wherein said coolant intake valve is in fluid communication with said reservoir, wherein said coolant is a cryogenic fluid and wherein said cryogenic fluid contacts said opposite sides of said superconducting shell within said reservoir.

9. The chamber set forth in claim 8, further comprising a structural housing supporting said reservoir and said superconducting shell.

10. The chamber set forth in claim 1, further comprising a nested superconducting shell surrounding the work product, a means for transferring energy into the chamber, and another electromagnetic shield situated within said superconducting shell.

11. A chamber for altering the relationship between strong force bonds in a work product, comprising:

a means for shielding the work product from electromagnetic radiation, electrical fields and magnetic fields;

a superconducting shell surrounding the work product, and wherein said superconducting shell has an open position and a closed position;

a means for transferring energy into the chamber from outside of the chamber and through said shielding means and through said superconducting shell; and a base to which said shielding means is mounted, said base being situated outside an exterior of said shielding means and said superconducting shell.

12. The chamber set forth in claim 11, wherein said shielding means comprises an electromagnetic shield positioned around said superconducting shell, wherein said energy transferring means comprises a wire conducting electricity into the chamber and wherein at least a portion of said wire is surrounded by a superconductive electromagnetically shielded sheath.

13. The chamber set forth in claim 11, further comprising an electromagnetic circuit within the chamber connected to an energy source outside the chamber through said wire, said wire conducting electricity through said base, said shielding means and said superconducting shell to said electromagnetic circuit.

14. The chamber set forth in claim 13, wherein said electromagnetic circuit is selected from a set of circuits consisting of a magnetic field generator, an electromagnetic field pulse, a laser, and a light.

15. The chamber set forth in claim 13, further comprising a plurality of said electromagnetic circuits equidistantly spaced within the chamber.

16. The chamber set forth in claim 11, wherein said energy transferring means consists of a kinetic transmission selected from a motive gas, a motive fluid, and a motive solid.

17. The chamber set forth in claim 16, wherein said kinetic transmission is further comprised of a directed or focused sound amplification system for work product perturbation.

18. The chamber set forth in claim 17, wherein said kinetic transmission is further comprised of a drive operatively connected to said superconducting shell through a shaft, said drive rotating said superconducting shell through said shaft.

19. The chamber set forth in claim 11, wherein said superconducting shell further comprises a plurality of superconducting sections within said shielding means, said plurality of superconducting sections partially enclosing the work product.

20. The chamber set forth in claim 11, further comprising a reservoir situated within said shielding means and containing a coolant in which at least one side of said superconducting shell is at least partially immersed.

21. A chamber for altering the relationship between strong force bonds in a work product, comprising:

an electromagnetic shield positioned around the work product, wherein said electromagnetic shield is substantially impervious to electromagnetic radiation, electrical fields and magnetic fields;

a superconducting shell situated within said electromagnetic shield and surrounding the work product; and a pair of Dewar flasks on opposite sides of said superconducting shell, at least one coolant within said pair of Dewar flasks and a coolant intake valve, wherein said pair of Dewar flasks form a reservoir containing said coolant and said superconducting shell, wherein said coolant intake valve is in fluid communication with said reservoir, wherein said coolant is a cryogenic fluid and wherein said cryogenic fluid contacts said opposite sides of said superconducting shell within said reservoir.

22. A chamber for reducing strong force bonds in a work product, comprising:

an outer casing;

an electromagnetic shield within said outer casing and positioned around the work product;

a superconducting shell within said outer casing and completely enclosing the work product;

a pair of Dewar flasks on opposite sides of said superconducting shell; and at least one coolant within said pair of Dewar flasks, wherein said pair of Dewar flasks form a reservoir containing said coolant and said superconducting shell.

23. The chamber set forth in claim 22, wherein said superconducting shell is selected from the group of superconducting walls consisting of a plurality of overlapping superconductive elements, a continuous superconductive element, a pair of opposing, interconnected superconductive halves, and a plurality of nested superconducting shells.

24. The chamber set forth in claim 22, wherein said superconducting shell is further comprised of a pair of interconnected hemispheres.

25. The chamber set forth in claim 24, further comprising a flange between said pair of interconnected hemispheres.

26. The chamber set forth in claim 25, wherein at least one of said pair of interconnected hemispheres overlaps the other of said pair of interconnected hemispheres and wherein said flange provides a pressure seal.

27. The chamber set forth in claim 26, further comprising a base for supporting said outer casing, a specimen table within the chamber for supporting the work product, and a coolant intake valve in fluid communication with said reservoir, wherein said coolant is a cryogenic fluid and wherein said cryogenic fluid contacts said opposite sides of said superconducting shell within said reservoir, wherein said pair of interconnected hemispheres have a first position in contact with each other and a second position apart from each other.

28. The chamber set forth in claim 22, further comprising a means for transferring energy into the chamber.

29. A chamber for altering the relationship between strong force bonds in a work product, comprising:

an electromagnetic shield positioned around the work product, wherein said electromagnetic shield is substantially impervious to electromagnetic radiation, electrical fields and magnetic fields;

a superconducting shell situated within said electromagnetic shield and surrounding the work product;

a reservoir situated within said electromagnetic shield and containing a coolant in contact with at least one side of said superconducting shell; and a base to which said electromagnetic shield is mounted.

30. The chamber set forth in claim 29, wherein said superconducting shell is comprised of a type-1 superconductor, said type-1 superconductor being at least partially immersed in said coolant.

31. A chamber for altering the relationship between strong force bonds in a work product, comprising:

a superconducting shell surrounding the work product and shielding the work product from substantially all electromagnetic radiation, electrical fields and magnetic fields, said superconducting shell comprising an exterior and an interior, wherein said superconducting shell comprises a first shell section and a second shell section, wherein said first section and said second section further comprise an overlapping section at an interconnection between said first section and said second section, and wherein said first shell section moves relative to said second shell section to provide said superconducting shell with an open position and a closed position;

a reservoir containing a coolant in contact with at least one side of said superconducting shell; and a base to which said exterior of said superconducting shield is mounted.

32. The chamber set forth in claim 31, further comprising a sound perturbation system in operative communication with the work product in said superconducting shell, wherein said superconducting shell is comprised of a type-1 superconductor and said reservoir is selected from the group of flasks consisting of a single-sided Dewar flask and a pair of Dewar flasks.

* * * * *